United States Patent
Tu

(10) Patent No.: US 10,658,175 B2
(45) Date of Patent: May 19, 2020

(54) SEMICONDUCTOR DEVICE AND MANUFACTURING METHOD THEREFOR

(71) Applicant: Semiconductor Manufacturing International Corporation (Shanghai), Shanghai (CN)

(72) Inventor: Ajin Tu, Shanghai (CN)

(73) Assignee: Semiconductor Manufacturing International Corporation (Shanghai), Shanghai (CN)

( * ) Notice: Subject to any disclaimer, the term of this patent is extended or adjusted under 35 U.S.C. 154(b) by 859 days.

(21) Appl. No.: 13/914,442

(22) Filed: Jun. 10, 2013

(65) Prior Publication Data
US 2014/0077279 A1 Mar. 20, 2014

(30) Foreign Application Priority Data
Sep. 19, 2012 (CN) .......................... 2012 1 0350791

(51) Int. Cl.
H01L 21/336 (2006.01)
H01L 21/02 (2006.01)
H01L 29/78 (2006.01)
H01L 29/08 (2006.01)
H01L 29/66 (2006.01)
H01L 29/165 (2006.01)

(52) U.S. Cl.
CPC .... *H01L 21/02532* (2013.01); *H01L 29/0847* (2013.01); *H01L 29/165* (2013.01); *H01L 29/66636* (2013.01); *H01L 29/78* (2013.01); *H01L 29/7848* (2013.01)

(58) Field of Classification Search
USPC ........................... 438/299–300; 257/E31.431
See application file for complete search history.

(56) References Cited

U.S. PATENT DOCUMENTS

| | | | | |
|---|---|---|---|---|
| 4,141,765 A | * | 2/1979 | Druminski | H01L 21/30608 257/622 |
| 2005/0266631 A1 | * | 12/2005 | Kim et al. | 438/216 |
| 2008/0054347 A1 | * | 3/2008 | Wang | 257/327 |
| 2010/0187578 A1 | * | 7/2010 | Faltermeier | H01L 29/66636 257/288 |
| 2012/0181625 A1 | * | 7/2012 | Kwok | H01L 29/165 257/408 |

* cited by examiner

*Primary Examiner* — Ali Naraghi
(74) *Attorney, Agent, or Firm* — Innovation Counsel LLP

(57) ABSTRACT

A semiconductor device and a manufacturing method therefor are provided. The semiconductor device includes a semiconductor substrate including a trench used for a source/drain region; and a SiGe seed layer formed simultaneously on the sidewall and bottom of the trench, and the SiGe seed layer on the sidewall of the trench has an uneven thickness with a maximum thickness at a location corresponding to the channel region in the semiconductor substrate. The semiconductor device and the manufacturing method therefor according to the present disclosure enable the SiGe seed layer to block diffusion of elements such as boron more effectively.

10 Claims, 4 Drawing Sheets

SEMICONDUCTOR DEVICE AND MANUFACTURING METHOD THEREFOR

CROSS-REFERENCE TO RELATED APPLICATION

This application claims priority to Chinese Patent Application No. 201210350791.1, filed on Sep. 19, 2012 and entitled "Semiconductor Device and Manufacturing Method therefor", which is incorporated herein by reference in its entirety.

BACKGROUND OF THE INVENTION

Field of the Invention

The present disclosure relates to a semiconductor device and a manufacturing method therefor, and in particular to a semiconductor device having an embedded silicon germanium (SiGe) source/drain region and a manufacturing method therefor.

Description of the Related Art

Embedded SiGe source/drain region structures have been widely used to improve the performance of PMOS devices. More specifically, a trench, which is used for the source/drain region of the PMOS device, is formed in a silicon (Si) substrate or well region, and a SiGe material is formed in the trench. Because the lattice constant of SiGe is greater than that of Si, the embedded SiGe source/drain region applies a compressive stress to the channel region of the PMOS device. This compressive stress increases the carrier mobility of the channel region of the PMOS device, thereby improving the performance of the PMOS device.

In the embedded SiGe source/drain region structure, a SiGe seed layer is usually formed in the trench (i.e., on the sidewall and bottom of the trench) before forming a SiGe bulk layer.

FIG. 1 shows a SiGe seed layer conventionally formed on the sidewalls and bottoms of trenches used for source/drain regions. Referring to FIG. 1, in a semiconductor device 1000, a gate structure 110 and gate sidewall spacers 120 are formed on a Si substrate 100. Trenches 130, which are used for source/drain regions, are formed in the Si substrate 100. In addition, a SiGe seed layer 140 is formed on the sidewalls and bottoms of the trenches 130.

As shown in FIG. 1, on the sidewalls of the trenches 130, the thickness of the SiGe seed layer 140 formed on the sidewalls is substantially even on the sidewalls, while on the bottoms of the two trenches 130, the thickness of the SiGe seed layer 140 is substantially even. However, because the speed at which the SiGe seed layer 140 grows on the (111) planes of the sidewalls of the trenches is generally smaller than the speed the SiGe seed layer 140 grows on the (100) planes of the bottoms of the trenches, the thickness "a" of the SiGe seed layer 140 on the sidewalls of the trenches is relatively smaller, and the thickness "b" of the SiGe seed layer 140 on the bottoms of the trenches is relatively larger.

SUMMARY OF THE INVENTION

A semiconductor device is provided including a semiconductor substrate including a trench used for a source/drain region; and a SiGe seed layer formed on the sidewall and bottom of the trench, wherein the SiGe seed layer on the sidewall of the trench has an uneven thickness, and the SiGe seed layer on the sidewall of the trench has a maximum thickness at a location corresponding to the channel region in the semiconductor substrate.

The SiGe seed layer on the bottom of the trench may have an even thickness.

A ratio of the maximum thickness of the SiGe seed layer on the sidewall of the trench to the thickness of the SiGe seed layer on the bottom of the trench may be in the range from about 1:2.5 to about 1:1.

The maximum thickness of the SiGe seed layer on the sidewall of the trench may be equal to or greater than about 10 nm.

The maximum thickness of the SiGe seed layer on the sidewall of the trench may be in the range from about 15 nm to about 16 nm.

The thickness of the SiGe seed layer on the bottom of the trench may be in the range from about 15 nm to about 25 nm.

The SiGe seed layer may have a Ge content in the range from about 5 at. % to about 20 at. %.

The semiconductor device may further include a SiGe bulk layer, wherein the SiGe bulk layer is formed on the SiGe seed layer on the sidewall and bottom of the trench, and the SiGe bulk layer is doped with boron.

The semiconductor device may further include a cap layer, wherein the cap layer is formed on the SiGe bulk layer, the cap layer has a Ge content in the range from about 0 at. % to about 10 at. %, and the SiGe bulk layer has a Ge content in the range from about 25 at. % to about 40 at. %.

A method for manufacturing a semiconductor device is also provided, the method including: forming in a semiconductor substrate a trench used for a source/drain region; and forming a SiGe seed layer simultaneously on the sidewall and bottom of the trench, wherein the SiGe seed layer on the sidewall of the trench has an uneven thickness, and the SiGe seed layer on the sidewall of the trench has a maximum thickness at a location corresponding to the channel region in the semiconductor substrate.

The SiGe seed layer on the bottom of the trench may have an even thickness.

A ratio of the maximum thickness of the SiGe seed layer on the sidewall of the trench to the thickness of the SiGe seed layer on the bottom of the trench may be in the range from about 1:2.5 to about 1:1.

The maximum thickness of the SiGe seed layer on the sidewall of the trench may be equal to or greater than about 10 nm.

The maximum thickness of the SiGe seed layer on the sidewall of the trench may be in the range from about 15 nm to about 16 nm.

The thickness of the SiGe seed layer on the bottom of the trench may be in the range from about 15 nm to about 25 nm.

The SiGe seed layer may have a Ge content in the range from about 5 at. % to about 20 at. %.

The SiGe seed layer may be formed by a selective epitaxial process with the following parameters: a temperature in the range from about 500° C. to about 800° C.; a pressure in the range from about 1 Torr to about 100 Torr; and gas flow rates of $SiH_4$ or $SiH_2Cl_2$, $GeH_4$, HCl in the range from about 1 sccm to about 1000 sccm, and a gas flow rate of $H_2$ in the range from about 0.1 slm to about 50 slm.

The SiGe seed layer may be formed by the selective epitaxial process with the following parameters: a temperature in the range from about 620° C. to about 650° C.; a pressure in the range from about 5 Torr to about 15 Torr; and a gas flow rate of HCl in the range from about 25 sccm to about 35 sccm.

The method for manufacturing the semiconductor device may further include: forming a SiGe bulk layer on the SiGe seed layer on the sidewall and bottom of the trench, wherein the SiGe bulk layer is doped with boron.

The method for manufacturing the semiconductor device may further include: forming a cap layer on the SiGe bulk layer, wherein the cap layer has a Ge content in the range from about 0 at. % to about 10 at. %, and the SiGe bulk layer has a Ge content in the range from about 25 at. % to about 40 at. %.

The semiconductor device and the manufacturing method therefor according to the present disclosure enable the SiGe seed layer to block diffusion of elements such as boron more effectively.

Additionally, the semiconductor device and the manufacturing method therefor according to the present disclosure further enable suppression of the reduction of the compressive stress applied by the embedded SiGe source/drain regions to the channel region.

BRIEF DESCRIPTION OF THE DRAWINGS

The accompanying drawings, which are incorporated in and constitute a part of the specification, illustrate embodiments of the present disclosure and, together with the description, serve to explain the principles of the present disclosure.

It is to be noted that, in the accompanying drawings, for convenience of description, the sizes of respective components may not be drawn to scale. Also, the same or similar reference signs represent the same or similar components in the accompanying drawings.

The objects, features and advantages of the present disclosure will become apparent from the following detailed description of exemplary embodiments with reference to the accompanying drawings.

DESCRIPTION OF THE EMBODIMENTS

The present disclosure will be described below with reference to the accompanying drawings. It shall be noted that the following description is merely illustrative and exemplary in nature, and is in no way intended to limit the present disclosure and its applications or uses. The relative arrangement of components and steps, numerical expressions and numerical values set forth in the embodiments do not limit the scope of the present disclosure unless it is otherwise specifically stated. In addition, techniques, methods and devices known by those of ordinary skill in the art may not be discussed in detail, but are intended to be a part of the specification where appropriate.

The present disclosure relates to a semiconductor device and a manufacturing method therefor. Semiconductor devices generally include both PMOS devices and NMOS devices. Because embedded SiGe source/drain regions are generally used for the PMOS devices, portions for forming the NMOS devices may be shielded with a mask and portions for forming the PMOS devices are exposed before manufacturing. In addition, in the present specification, the term "source/drain region" may refer not only to the source region and the drain region, but also to the source region or the drain region.

Figure 1:
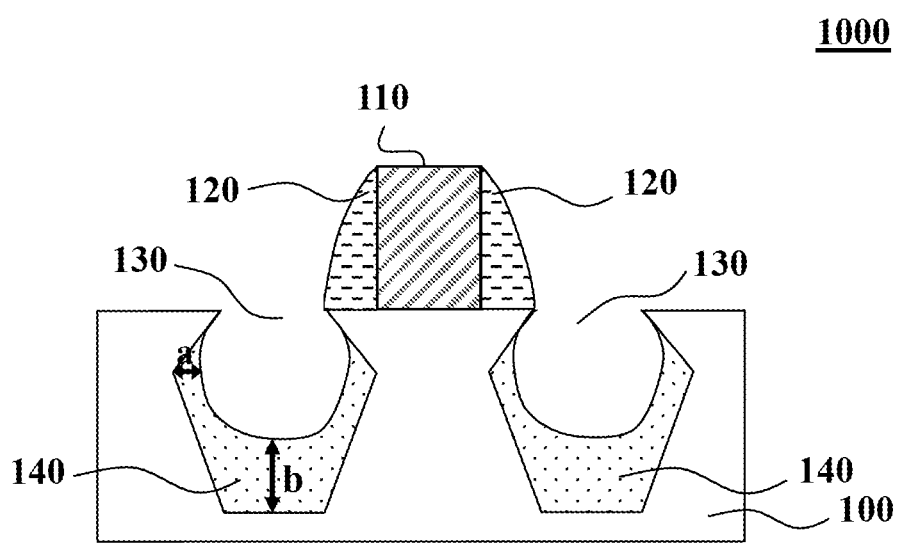
FIG. 1 is a schematic sectional view showing a SiGe seed layer conventionally formed on the sidewalls and bottoms of trenches used for source/drain regions.

Viewing FIG. 1, the relative thinness of the SiGe seed layer on the sidewalls of the trenches 130, and also the difference in thicknesses of the SiGe seed layer between the sidewalls and the bottom of the trenches 130, can deteriorate the performance of the device. The SiGe seed layer may, for example, have the functions of both serving as a seed for forming the SiGe bulk layer and of blocking diffusion of elements such as boron (B). Therefore, when the thickness "a" of the SiGe seed layer on the sidewalls of the trenches is relatively smaller, a problem is generally caused, i.e., diffusion of elements such as boron cannot be blocked effectively. This deteriorates the performance of the PMOS device.

Additionally, when the thickness "b" of the SiGe seed layer on the bottoms of the trenches is relatively larger, another problem can result. In particular, the thickness of the SiGe bulk layer embedded into the trenches is decreased in the case of a given trench depth, thereby reducing the compressive stress applied to the channel region. This also deteriorates the performance of the PMOS device.

Figure 2:
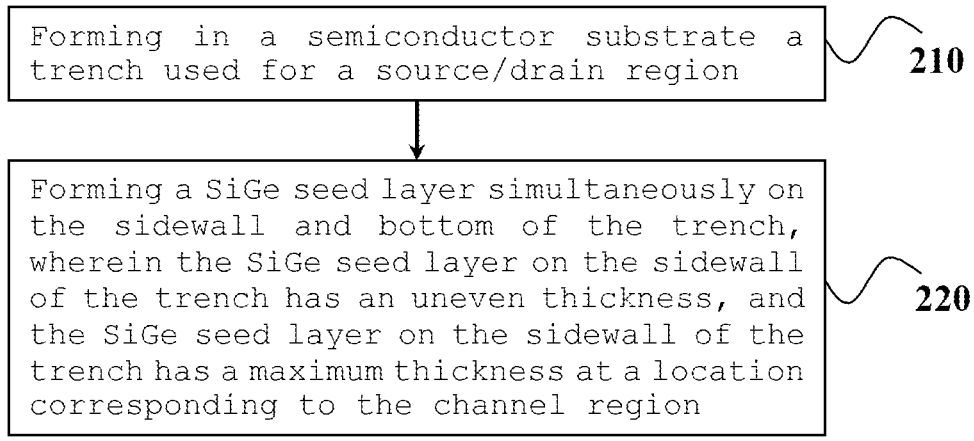
FIG. 2 is a flowchart of a method of manufacturing a semiconductor device according to one embodiment of the present disclosure.

FIG. 2 shows a flowchart of a method of manufacturing a semiconductor device according to one embodiment of the present disclosure. First, in step 210 of FIG. 2, a trench used for a source/drain region is formed in a semiconductor substrate. Then, in step 220 of FIG. 2, a SiGe seed layer is formed simultaneously on the sidewall and bottom of the trench. In the method of manufacturing the semiconductor device as shown in FIG. 2, the SiGe seed layer formed on the sidewall of the trench has an uneven thickness. Specifically, the SiGe seed layer on the sidewall of the trench has a maximum thickness at a location along the sidewall of the trench corresponding to the channel region (as described in more detail below with respect to FIG. 4B-4D). As a result, the SiGe seed layer on the sidewall of the trench has an increased effective thickness for blocking diffusion of elements such as boron. This increased thickness enables the SiGe seed layer of the present disclosure to block diffusion of elements such as boron more effectively, thereby improving the performance of the PMOS device.

Figure 3:
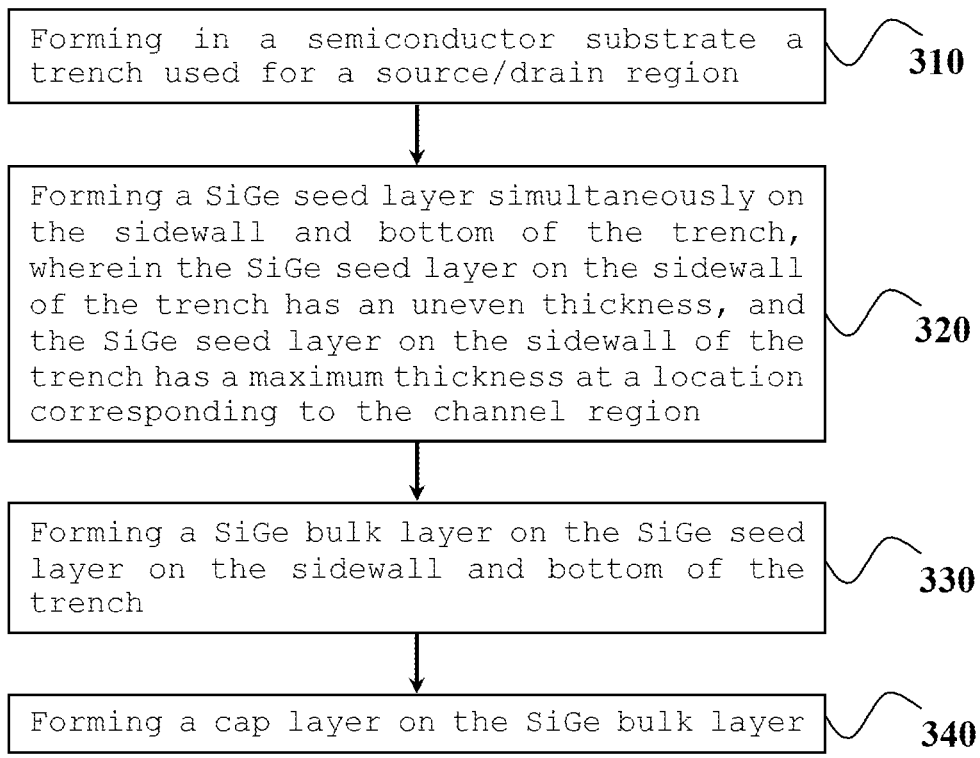
FIG. 3 is a flowchart of a method of manufacturing a semiconductor device according to another embodiment of the present disclosure.

Another embodiment of the present disclosure will be described in more detail below with reference to FIGS. 3 and 4A-4D, wherein FIG. 3 is a flowchart of a method of manufacturing a semiconductor device according to another embodiment of the present disclosure, and FIGS. 4A-4D are schematic sectional views showing structures obtained after respective steps of the manufacturing method of FIG. 3.

Figure 4A:
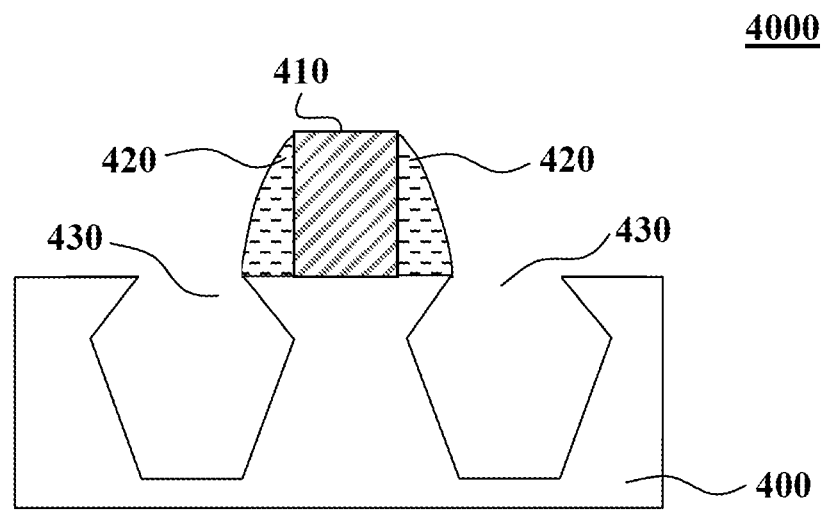
FIG. 4A is a schematic sectional view showing trenches used for source/drain regions according to an embodiment of the present disclosure.

First, in step 310 of FIG. 3, trenches 430 used for source/drain regions are formed in a semiconductor substrate 400 (referring to FIG. 4A).

The material used for the semiconductor substrate 400 is not particularly limited, and it may, for example, be a Si substrate, a Ge substrate, a SiGe substrate or any other appropriate substrate. Prior to forming the trenches 430, a gate structure 410 and gate sidewall spacers 420 are usually formed on the semiconductor substrate 400.

The trenches 430 may be formed through any appropriate process as are known to those of ordinary skill in the art. For example, the trenches 430 may be formed by dry-etching the semiconductor substrate 400 using the gate sidewall spacers 420 as a mask, but the process is not limited thereto.

The trenches 430 may have, for example, a "Σ" shape as shown in FIG. 4A, in which the sidewalls are bent into the substrate. The trenches 430 may alternatively have, for example, a stepped shape, a "U" shape or any other appropriate shape. In addition, the trenches 430 may have a depth determined according to a desired depth of the source/drain regions.

Figure 4B:
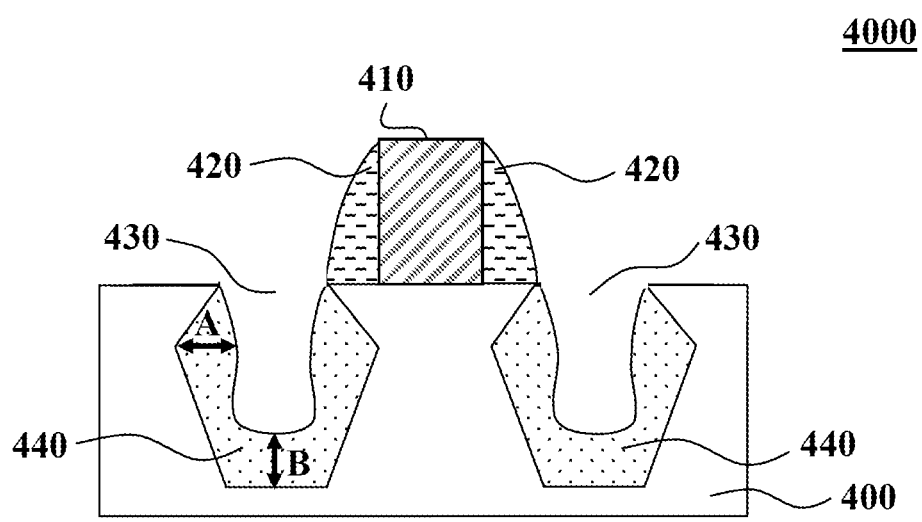
FIG. 4B is a schematic sectional view showing a SiGe seed layer formed on the sidewalls and bottoms of the trenches used for the source/drain regions according to an embodiment of the present disclosure.

Next, in step 320 of FIG. 3, a SiGe seed layer 440 is formed in the trenches 430, more specifically, the SiGe seed layer 440 is formed simultaneously on the sidewalls and bottoms of the trenches 430 (referring to FIG. 4B).

The SiGe seed layer 440 may be formed by a selective epitaxial process, but it is not limited thereto. In an embodiment of the present disclosure, for example, the SiGe seed layer 440 is formed by a selective epitaxial process with the following parameters: a temperature in the range from about 500° C. to about 800° C.; a pressure in the range from about 1 Torr to about 100 Torr; and gas flow rates of $SiH_4$ (or $SiH_2Cl_2$), $GeH_4$ and HCl in the range from about 1 sccm to about 1000 sccm, and a gas flow rate of $H_2$ in the range from about 0.1 slm to about 50 slm.

For example, in embodiments of the present disclosure, the temperature may be about 550° C., 600° C., 650° C., 700° C., 750° C. or the like; the pressure may be about 10 Torr, 20 Torr, 30 Torr, 40 Torr, 50 Torr, 60 Torr, 70 Torr, 80 Torr, 90 Torr or the like; the gas flow rates of $SiH_4$ (or $SiH_2Cl_2$), $GeH_4$ and HCl may be about 10 sccm, 50 sccm, 80 sccm, 100 sccm, 200 sccm, 300 sccm, 400 sccm, 500 sccm, 600 sccm, 700 sccm, 800 sccm, 900 sccm or the like; and the gas flow rate of $H_2$ may be about 1 slm, 5 slm, 10 slm, 20 slm, 30 slm, 40 slm or the like.

More specifically, in one example of the present disclosure, for example, the SiGe seed layer 440 may be formed by the selective epitaxial process using the following parameters: the temperature in the range from about 620° C. to about 650° C.; the pressure in the range from about 5 Torr to about 15 Torr; and the gas flow rate of HCl in the range from about 25 sccm to about 35 sccm. Other conditions are as described above.

As described above with reference to FIG. 1, the conventionally formed SiGe seed layer 140 has a substantially even thickness on the sidewalls of the trenches, and the thickness "a" of the SiGe seed layer 140 on the sidewalls of the trenches is relatively smaller usually. This causes the problem that diffusion of elements such as boron can not be effectively blocked.

After extensive and in-depth investigations, it was found that, when certain appropriate parameters as described above are adopted to selectively epitaxially grow the SiGe seed layer, the resultant SiGe seed layer has an unexpected sectional profile as shown in FIG. 4B, and the sectional profile can be obtained reproducibly. More specifically, the SiGe seed layer 440 on the sidewalls of the trenches 430 has an uneven thickness. In particular, the SiGe seed layer 440 can be formed on the sidewalls of the trenches 430 to have a maximum thickness "A" as shown in FIG. 4B (i.e., the thickness at "A" is greater than the thicknesses of the SiGe seed layer 440 at other locations on the sidewalls of the trenches 430). The position along the sidewall at which the SiGe seed layer has maximum thickness "A" may be located at an upper portion of the sidewall (closer to the top of the substrate 400 and gate structure 410). For example, as shown in FIG. 4B, the position along the sidewall at which the SiGe seed layer has a maximum thickness "A" may correspond to a position in an upper part of substrate 400 where, in a trench having a "Σ" shape, the trench is bent into the substrate 400, near the gate electrode 410. Generally the position along the sidewall at which the SiGe seed layer has maximum thickness "A" is at a location corresponding to the channel region, which is the region between the source and drain through which current flows in the semiconductor device. When the SiGe seed layer on the sidewalls of the trenches has a maximum thickness at the location corresponding to the location of the channel region, the effective thickness of the SiGe seed layer on the sidewalls of the trenches for blocking diffusion of elements such as boron is increased. Therefore, as compared with the conventional case, the SiGe seed layer of the present disclosure can block diffusion of elements such as boron more effectively, thereby improving the performance of the PMOS device.

Furthermore, as shown in FIG. 4B, the SiGe seed layer 440 on the bottoms of the trenches 430 may have an even thickness (in the present specification, the term "even" refers to substantially even, for example, the error—or difference—between the two is within about ±5%) which is denoted by "B".

In some examples of the present disclosure, a ratio of the maximum thickness "A" of the SiGe seed layer 440 on the sidewalls of the trenches 430 to the thickness "B" of the SiGe seed layer 440 on the bottoms of the trenches 430 may, for example, be in the range from about 1:2.5 to about 1:1. That is, according to the present disclosure, for example, the thickness "A" may be equal to the thickness "B".

As described above with reference to FIG. 1, in the conventional case, the thickness "a" of the SiGe seed layer 140 on the sidewalls of the trenches is relatively smaller and the thickness "b" of the SiGe seed layer 140 on the bottoms of the trenches is relatively larger, for example, a ratio of "a" to "b" is usually greater than or equal to about 1:4 and smaller than about 1:2.5. On the one hand, this may cause the problem that diffusion of elements such as boron can not be effectively blocked; on the other hand, this may cause the problem that the thickness of the SiGe bulk layer embedded into the trenches is decreased in the case of a given trench depth, thereby reducing the compressive stress applied to the channel region. However, in the present disclosure (referring to FIG. 4B), the thickness "A" of the SiGe seed layer 440 on the sidewalls of the trenches is larger compared to the conventional case, and the thickness "B" of the SiGe seed layer 440 on the bottoms of the trenches may, at the same time, be smaller compared to the conventional case, for example, a ratio of "A" to "B" may be in the range from about 1:2.5 to about 1:1. Because the maximum thickness of the SiGe seed layer on the sidewalls of the trenches may be larger in semiconductor device of the present disclosure compared to the conventional case, in the semiconductor device of the present disclosure diffusion of elements such as boron can be blocked more effectively, thereby improving the performance of the PMOS device. At the same time, because the thickness of the SiGe seed layer on the bottoms of the trenches may be smaller in the semiconductor device of the present disclosure as compared to the conventional case, the present disclosure may further increase the thickness of the SiGe bulk layer embedded into the trenches in the case of a given trench depth, thereby applying a greater compressive stress to the channel region. This will improve the performance of the PMOS device more advantageously.

In the methods used to form a semiconductor device in the conventional case, to increase the thickness of the SiGe seed layer on the sidewalls of the trenches is to be increased so as to block diffusion of elements such as boron effectively, the SiGe seed layer on the bottoms of the trenches will likely become too thick, whereby the compressive stress applied to the channel region will be reduced due to the decrease of the thickness of the SiGe bulk layer embedded into the trenches. On the other hand, if the thickness of the SiGe seed layer on the bottoms of the trenches is to be decreased so as to increase the compressive stress applied to the channel region by increasing the thickness of the SiGe bulk layer embedded into the trenches, the SiGe seed layer on the sidewalls of the trenches will likely be too thin, whereby it will be hard to block diffusion of elements such as boron effectively. In contrast, in the semiconductor device formed using the methods of the present disclosure, because the maximum thickness of the SiGe seed layer on the sidewalls of the trenches may be larger compared to the conventional case and at the same time the thickness of the SiGe seed layer on the bottoms of the trenches may be smaller compared to the conventional case, diffusion of elements such as boron may be blocked more effectively and at the same time the thickness of the SiGe bulk layer embedded into the trenches may be increased, thereby applying a larger compressive stress to the channel region. This will improve the performance of the PMOS device more advantageously.

In some examples of the present disclosure, the maximum thickness "A" of the SiGe seed layer on the sidewalls of the trenches is equal to or greater than about 10 nm, up to, for example, the width of the trench. SiGe seed layers this thick may block diffusion of elements such as boron effectively. For example, the maximum thickness "A" of the SiGe seed layer on the sidewalls of the trenches may be in the range from about 10 nm to about 25 nm, or, in another example, in the range of about 15 nm to about 16 nm. Moreover, the thickness "B" of the SiGe seed layer on the bottoms of the trenches may, for example, be in the range from about 15 nm to about 25 nm.

The SiGe seed layer 440 may, for example, have a Ge content in the range from about 5 at. % to about 20 at. %, but it is not limited thereto.

Figure 4C:
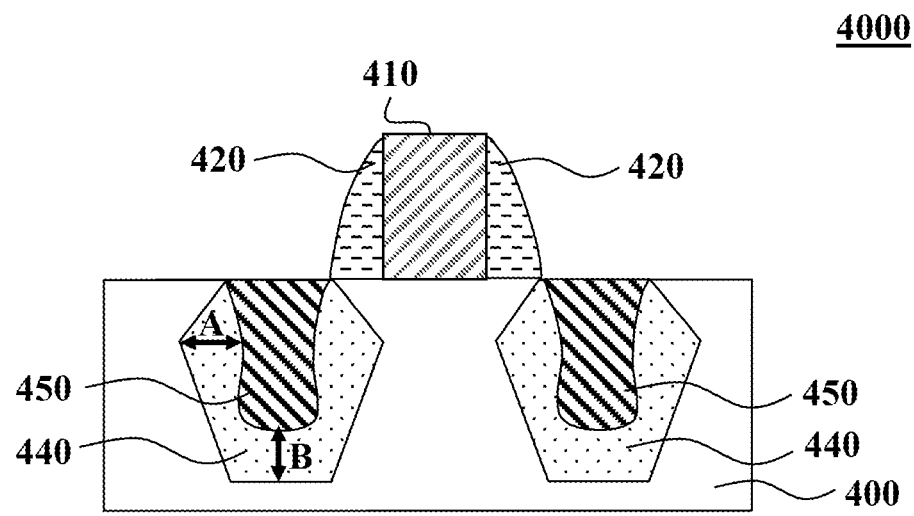
FIG. 4C is a schematic sectional view showing a SiGe bulk layer formed on the SiGe seed layer according to an embodiment of the present disclosure.

Referring again to FIG. 3, in, optional, step 330 of FIG. 3, a SiGe bulk layer 450 is formed in the trenches 430, more specifically, the SiGe bulk layer 450 is formed on the SiGe seed layer 440 on the sidewalls and bottoms of the trenches 430 (referring to FIG. 4C).

The SiGe bulk layer 450 may be formed by a selective epitaxial process, but it is not limited thereto. Optionally, the SiGe bulk layer 450 may be doped with boron. This may, for example, be realized by performing in-situ boron doping while selectively epitaxially growing the SiGe bulk layer 450. In an embodiment of the present disclosure, for example, the SiGe bulk layer 450 is formed by a selective epitaxial process with the following parameters: a temperature in the range from about 500° C. to about 800° C.; a pressure in the range from about 1 Torr to about 100 Torr; and gas flow rates of $SiH_4$ (or $SiH_2Cl_2$), $GeH_4$ and HCl in the range from about 1 sccm to about 1000 sccm, and a gas flow rate of $H_2$ in the range from about 0.1 slm to about 50 slm. When the SiGe bulk layer 450 is to be doped with boron, the gas flow rate of $B_2H_6$ is, for example, in the range from about 1 sccm to about 1000 sccm. In one example of the present disclosure, for instance, the SiGe bulk layer 450 may be formed by the selective epitaxial process with the following parameters: the temperature in the range from about 620° C. to about 650° C.; the pressure in the range from about 5 Torr to about 15 Torr; and the gas flow rate of HCl in the range from about 25 sccm to about 35 sccm. Other conditions are as described above.

The SiGe bulk layer 450 usually has a larger Ge content in atomic percent than the SiGe seed layer 440, for example, the SiGe bulk layer 450 may have a Ge content in the range from about 25 at. % to about 40 at. %, but it is not limited thereto. Additionally, when the SiGe bulk layer 450 is doped with boron, the concentration of boron may be determined as needed.

Although an upper surface of the SiGe bulk layer 450 is level with an upper surface of the semiconductor substrate 400 as shown in FIG. 4C, the upper surface of the SiGe bulk layer 450 may also be higher or lower than the upper surface of the semiconductor substrate 400 according to specific processing conditions and/or needs of the device, which does not influence the implementation of the present disclosure. Furthermore, it is to be noted that, in some embodiments of the present disclosure, the SiGe bulk layer forming step 330 is not necessarily performed.

Figure 4D:
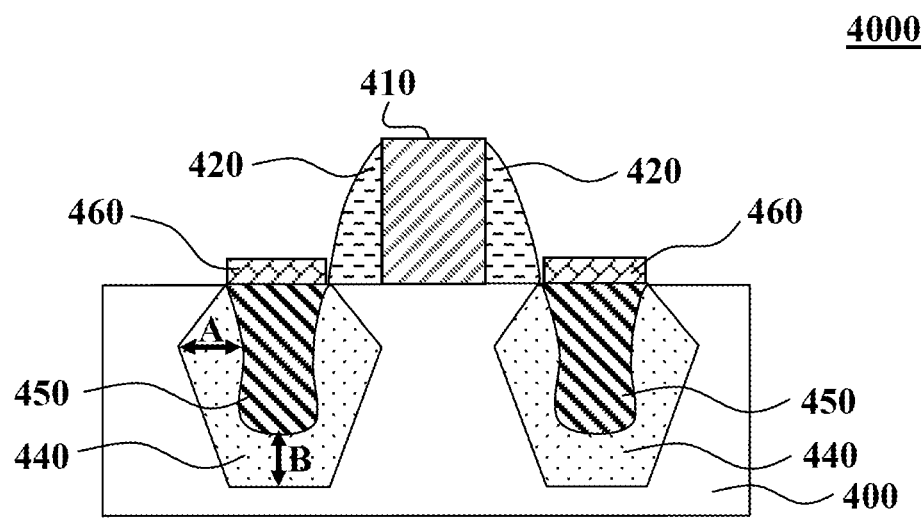
FIG. 4D is a schematic sectional view showing a cap layer formed on the SiGe bulk layer according to an embodiment of the present disclosure.

Finally, in step 340 of FIG. 3, a cap layer 460 may be formed on the SiGe bulk layer 450 (referring to FIG. 4D).

The cap layer 460 may provide Si when subsequently forming a metal silicide on the surfaces of the source/drain regions. For example, the cap layer 460 may be used for forming a high quality NiSi film. The cap layer 460 may be formed by any appropriate process as are known to those of ordinary skill in the art.

The cap layer 460 usually has a smaller Ge content in atomic percent than the SiGe bulk layer 450, for example, the cap layer 460 may have a Ge content in the range from about 0 at. % to about 10 at. %, but it is not limited thereto.

An upper surface of the cap layer 460 may be higher than (i.e., positioned above) the upper surface of the semiconductor substrate 400 as shown in FIG. 4D, or it may be level with the upper surface of the semiconductor substrate 400. Moreover, the thickness of the cap layer 460 may be determined as needed.

In some embodiments of the present disclosure, the cap layer forming step 340 is not performed.

According to the method of the present disclosure as described above, a semiconductor device 4000 may be formed (referring to FIG. 4B). The semiconductor device 4000 comprises: a semiconductor substrate 400 in which a trench 430 used for a source/drain region is formed; and a SiGe seed layer 440 formed simultaneously on the sidewall and bottom of the trench 430, wherein the SiGe seed layer 440 on the sidewall of the trench 430 has an uneven thickness, and the SiGe seed layer 440 on the sidewall of the trench 430 has a maximum thickness "A" at a location corresponding to the position of the channel region.

Optionally, the SiGe seed layer 440 on the bottom of the trench 430 has an even thickness.

Optionally, a ratio of the maximum thickness "A" of the SiGe seed layer 440 on the sidewall of the trench 430 to the thickness "B" of the SiGe seed layer 440 on the bottom of the trench 430 is in the range from about 1:2.5 to about 1:1.

Optionally, the maximum thickness "A" of the SiGe seed layer 440 on the sidewall of the trench 430 is equal to or greater than about 10 nm.

Optionally, the maximum thickness "A" of the SiGe seed layer 440 on the sidewall of the trench 430 is in the range from about 15 nm to about 16 nm.

Optionally, the thickness "B" of the SiGe seed layer 440 on the bottom of the trench 430 is in the range from about 15 nm to about 25 nm.

Optionally, the SiGe seed layer 440 has a Ge content in the range from about 5 at. % to about 20 at. %.

Optionally, the semiconductor device 4000 further includes a SiGe bulk layer 450 (referring to FIG. 4C), and the SiGe bulk layer 450 is formed on the SiGe seed layer 440 that is on the sidewall and bottom of the trench 430, and the SiGe bulk layer 450 is doped with boron.

Optionally, the semiconductor device 4000 further includes a cap layer 460 (referring to FIG. 4D), and the cap layer 460 is formed on the SiGe bulk layer 450, the cap layer 460 has a Ge content in the range from about 0 at. % to about 10 at. %, and the SiGe bulk layer 450 has a Ge content in the range from about 25 at. % to about 40 at. %.

The semiconductor device and the manufacturing method therefor according to the present disclosure enable the SiGe seed layer to block diffusion of elements such as boron more effectively. Additionally, the semiconductor device and the manufacturing method therefor according to the present disclosure further enable suppression of the reduction of the compressive stress applied by the embedded SiGe source/drain regions to the channel region.

The semiconductor device and the manufacturing method therefor according to the present disclosure have been described in detail. Certain details well known to those of ordinary skill in the art are not described in order to avoid obscuring the concept of the present disclosure. Those persons of ordinary skill in the art may thoroughly understand how to implement the technical solutions disclosed herein according to the above description.

While the present disclosure has been described with reference to exemplary embodiments, it is to be understood that the present disclosure is not limited to the above exemplary embodiments. The above exemplary embodiments may be modified without departing from the scope and spirit of the present disclosure including the appended claims.

What is claimed is:

1. A method for manufacturing a semiconductor device comprising:
   forming in a semiconductor substrate a trench used for a source/drain region; and
   forming a single SiGe seed layer simultaneously on an entirety of a sidewall and bottom of the trench,
   wherein the single SiGe seed layer on the sidewall of the trench has an uneven thickness and has a maximum thickness at a location corresponding to a channel region in the semiconductor substrate, and
   completing the forming of the single SiGe seed layer when a ratio of the maximum thickness of the SiGe seed layer on the sidewall of the trench to the thickness of the SiGe seed layer on the bottom of the trench is in the range from about 1:2.5 to about 1:1.

2. The method for manufacturing the semiconductor device according to claim 1, wherein the SiGe seed layer on the bottom of the trench has an even thickness.

3. The method for manufacturing the semiconductor device according to claim 2, wherein the thickness of the SiGe seed layer on the bottom of the trench is in the range from about 15 nm to about 25 nm.

4. The method for manufacturing the semiconductor device according to claim 1, wherein the maximum thickness of the SiGe seed layer on the sidewall of the trench is equal to or greater than about 10 nm.

5. The method for manufacturing the semiconductor device according to claim 4, wherein the maximum thickness of the SiGe seed layer on the sidewall of the trench is in the range from about 15 nm to about 16 nm.

6. The method for manufacturing the semiconductor device according to claim 1, wherein the SiGe seed layer has a Ge content in the range from about 5 at. % to about 20 at. %.

7. The method for manufacturing the semiconductor device according to claim 1, wherein the SiGe seed layer is formed by a selective epitaxial process with the following parameters:
   a temperature in the range from about 500° C. to about 800° C.;
   a pressure in the range from about 1 Torr to about 100 Torr; and
   gas flow rates of $SiH_4$ or $SiH_2Cl_2$, $GeH_4$, HCl in the range from about 1 sccm to about 1000 sccm, and a gas flow rate of $H_2$ in the range from about 0.1 slm to about 50 slm.

8. The method for manufacturing the semiconductor device according to claim 7, wherein the SiGe seed layer is formed by the selective epitaxial process with the following parameters:
   a temperature in the range from about 620° C. to about 650° C.;
   a pressure in the range from about 5 Torr to about 15 Torr; and
   a gas flow rate of HCl in the range from about 25 sccm to about 35 sccm.

9. The method for manufacturing the semiconductor device according to claim 1, further comprising:
   forming a SiGe bulk layer on the SiGe seed layer on the sidewall and bottom of the trench, wherein the SiGe bulk layer is doped with boron.

10. The method for manufacturing the semiconductor device according to claim 9, further comprising:
    forming a cap layer on the SiGe bulk layer, wherein the cap layer has a Ge content in the range from about 0 at. % to about 10 at. %, and the SiGe bulk layer has a Ge content in the range from about 25 at. % to about 40 at. %.

* * * * *